US011069544B2

(12) United States Patent
Deak (10) Patent No.: US 11,069,544 B2
(45) Date of Patent: Jul. 20, 2021

(54) RAPID THERMAL PROCESSING METHOD AND APPARATUS FOR PROGRAMMING THE PINNED LAYER OF SPINTRONIC DEVICES

(71) Applicant: MultiDimension Technology Co., Ltd., Zhangjiagang (CN)

(72) Inventor: James Geza Deak, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 937 days.

(21) Appl. No.: 15/570,093

(22) PCT Filed: Apr. 26, 2016

(86) PCT No.: PCT/CN2016/080195
§ 371 (c)(1),
(2) Date: Oct. 27, 2017

(87) PCT Pub. No.: WO2016/173481
PCT Pub. Date: Nov. 3, 2016

(65) Prior Publication Data
US 2018/0158702 A1    Jun. 7, 2018

(30) Foreign Application Priority Data

Apr. 27, 2015  (CN) .......................... 201510204777.4

(51) Int. Cl.
*H01L 21/67* (2006.01)
*G01R 33/09* (2006.01)
(Continued)

(52) U.S. Cl.
CPC .... *H01L 21/67098* (2013.01); *G01R 33/0052* (2013.01); *G01R 33/09* (2013.01);
(Continued)

(58) Field of Classification Search
CPC ............... H01L 21/67115; H01L 29/06; H01L 21/67098; H01L 21/677; H01L 43/12;
(Continued)

(56) References Cited

U.S. PATENT DOCUMENTS

2007/0182407 A1\* 8/2007 Sato ...................... G01R 33/09
324/252
2007/0187670 A1\* 8/2007 Hsu ........................ H01L 21/268
257/24
(Continued)

FOREIGN PATENT DOCUMENTS

CN    1497749 A    5/2004
CN    1740804      3/2006
(Continued)

OTHER PUBLICATIONS

"International Application No. PCT/CN2016/080195, International Search Report and Written Opinion dated Jul. 26, 2016", (dated Jul. 26, 2016), 12 pgs.

(Continued)

*Primary Examiner* — Dana Ross
*Assistant Examiner* — Michael S. Poetzinger
(74) *Attorney, Agent, or Firm* — Schwegman Lundberg & Woessner, P.A.

(57) ABSTRACT

A rapid thermal processing method and apparatus used for programming the pinned layer of spintronic devices, the apparatus comprising a rapid thermal annealing light source, a reflective cover, a magnet, a wafer, and a substrate. The light source is used for heating the substrate. The reflective cover at least comprises a transparent insulating layer and a reflective layer. The magnet is used to produce a constant magnetic field. An antiferromagnetic layer on a wafer may be locally programmed by controlling the exposure time, for heating a specific area on the wafer to a temperature above (Continued)

the blocking temperature of the antiferromagnetic layer, and then turning off the magnetic field after the heating area has cooled in the presence of the applied magnetic field. This rapid thermal processing method is used to improve the spatial resolution of laser annealing. It provides excellent performance, and it is suitable for mass production.

21 Claims, 9 Drawing Sheets

(51) Int. Cl.
    *H01L 43/12* (2006.01)
    *G01R 33/00* (2006.01)
    *H01L 21/677* (2006.01)
    *H05B 3/00* (2006.01)

(52) U.S. Cl.
    CPC ............ *H01L 21/677* (2013.01); *H01L 43/12* (2013.01); *H05B 3/0047* (2013.01)

(58) Field of Classification Search
    CPC .. G01R 33/0052; G01R 33/09; H05B 3/0047; H02M 5/00; G05F 1/44
    USPC ...................................................... 219/444.1
    See application file for complete search history.

(56) References Cited

U.S. PATENT DOCUMENTS

| | | | |
|---|---|---|---|
| 2007/0297222 A1 | 12/2007 | Leuschner | |
| 2011/0003485 A1* | 1/2011 | Sopori | H01L 21/324 438/795 |
| 2011/0108888 A1 | 5/2011 | Or-bach et al. | |
| 2013/0122672 A1 | 5/2013 | Or-bach et al. | |
| 2014/0254245 A1 | 9/2014 | Tadepalli et al. | |
| 2015/0214473 A1* | 7/2015 | Hurley | H01L 43/12 438/3 |

FOREIGN PATENT DOCUMENTS

| | | |
|---|---|---|
| CN | 1748268 A | 3/2006 |
| CN | 1934652 A | 3/2007 |
| CN | 101101869 | 1/2008 |
| CN | 102099898 | 6/2011 |
| CN | 102208530 A | 10/2011 |
| CN | 104900802 | 9/2015 |
| CN | 204680696 | 9/2015 |
| EP | 1661851 A1 | 5/2006 |
| EP | 2639593 A1 | 9/2013 |
| JP | 2005081465 A | 3/2005 |
| JP | 2013191268 A | 9/2013 |
| WO | WO-2016173481 | 11/2016 |

OTHER PUBLICATIONS

"Chinese Application No. 201510204777.4 First Office Action dated Feb. 27, 2017", (dated Feb. 27, 2017), 7 pgs.
"Chinese Application No. 201510204777.4, Chinese Search Report dated Feb. 15, 2017", (dated Feb. 15, 2017), 2 pgs.
"Chinese Application No. 201510204777.4, Notification to Grant Patent Right for Invention dated Oct. 30, 2017", (dated Oct. 30, 2017), 2 pgs.
"European Application No. 16785912, Supplementary European Search Report dated Dec. 7, 2018", (dated Dec. 7, 2018), 2 pgs.
"Japanese Application No. 2017-555796, Notice of Reasons for Refusal dated May 12, 2019'", (dated May 12, 2019), 4 pgs.
"Japanese Application No. 2017-555796, Notice of Reasons for Refusal dated Sep. 29, 2020'", (dated Sep. 29, 2020), 2 pgs.
"Japanese Application No. 2017-555796, Response filed Aug. 12, 2020", (Aug. 12, 2020), 3 pgs.

\* cited by examiner

RAPID THERMAL PROCESSING METHOD AND APPARATUS FOR PROGRAMMING THE PINNED LAYER OF SPINTRONIC DEVICES

PRIORITY CLAIM TO RELATED APPLICATIONS

This application is a U.S. national stage application filed under 35 U.S.C. § 371 from International Application Ser. No. PCT/CN2016/080195, which was filed 26 Apr. 2016, and published as WO2016/173481 on 3 Nov. 2016, and which claims priority to Chinese Application No. 201510204777.4, filed 27 Apr. 2015, which applications and publication are incorporated by reference as if reproduced herein and made a part hereof in their entirety, and the benefit of priority of each of which is claimed herein.

TECHNICAL FIELD

The present invention relates to the fields of giant magnetoresistance (GMR) spin valves and tunneling magnetoresistance (TMR) magnetic sensors, and in particular, to a rapid thermal processing method and apparatus for spintronic devices.

RELATED ART

Magnetic sensors have been widely applied to modern measurement systems, to measure multiple physical quantities, including but not limited to physical quantities such as intensity of a magnetic field, a current, a displacement, and a direction. There have already been multiple sensors that can be used to measure physical quantities such as the magnetic field.

A push-pull bridge sensor is more sensitive than single-resistor and reference-resistor bridge sensors, and also has a temperature compensation function to suppress impact from a temperature drift. A push-pull bridge requires pinned layers of magnetic tunnel junctions (MTJs) in two bridge arm resistors to have opposite magnetic moment directions. However, because the same magnetic field intensity is usually required for magnetic moment reversal of MTJs deposited on a same silicon chip, pinned layers of magnetoresistors on the same silicon chip usually have a same magnetic moment. Therefore, it is difficult to deposit, on a same silicon chip, two adjacent magnetoresistors with pinned layers having opposite magnetic moments. Currently, people commonly use a double film forming process, in which MTJ elements with pinned layers having opposite directions are separately deposited in separate depositions. This leads to a complex manufacturing process. In addition, annealing in the second process may obviously affect a thin film that is deposited in the first process, resulting in poor consistency between films formed at twice, making it difficult to match bridge arms, which may lead to a large deviation and affect the overall performance of the sensor. Currently, no good technology or commercially available device can complete such a process.

A laser direct writing technology is a type of laser annealing, in which a laser beam scans the surface to perform an annealing process at a particular localized position on the wafer surface. The laser annealing system provides a rapid heating rate, a rapid cooling rate, and reduces the thermal budget. Studies on the effect of laser radiation on solid may be traced back to 1971. Since then, many different types of laser annealing systems have been applied to processing systems for semiconductor devices in dopant activation. During laser irradiation, the solid is bombarded with a photon beam focused on a sample. The photons interact with energy transferred from the sample to crystal lattices, and the energy locally heats the sample. A light wavelength determines how the energy is absorbed into the solid. The laser annealing technology is currently an emerging technology in the field of magnetic sensors.

Figure 1A:
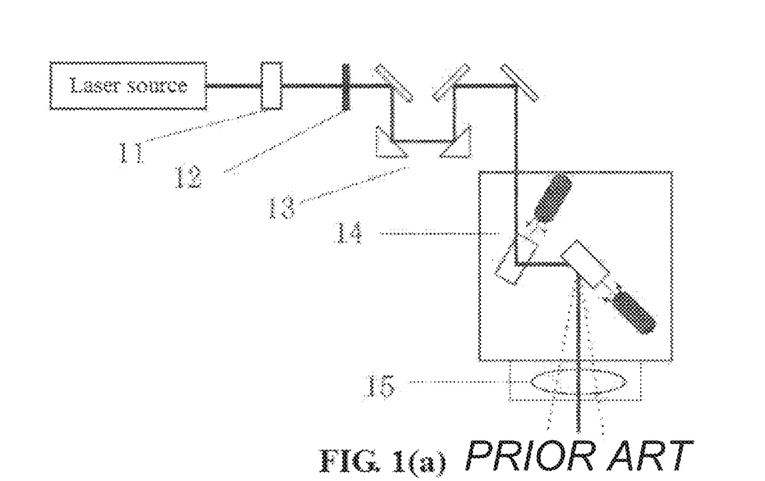
FIGS. 1(a) and 1(b) show laser direct writing systems of spintronic devices.
Figure 1B:
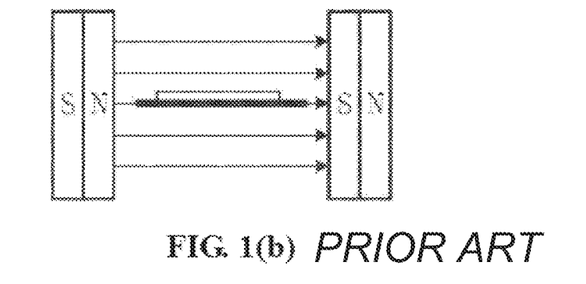

However, in the prior art, there is already a realignment technology, in which rapidly scanned and focused laser is used, through the laser direct writing technology, to irradiate spintronic layers for switching magnetic bias directions. This technology has been developed, and is used to set the pinned layer of an MTJ sensor, as shown in FIG. 1. As shown in FIG. 1($a$), 11 is a modulator, 12 is a optical slit, 13 is a laser beam attenuator, 14 is a galvanicscanner, and 15 is an optical lens. A laser system provides continuous and pulse laser radiation. The laser beam is scanned rapidly by using the galvanic scanner, and is focused on an optical lens with a focal length of 80 mm and a focal radius of 12 μm. In FIG. 1($b$), two assembled permanent magnets provide an external magnetic field. In such a manner, a relatively uniform magnetic field is present between two magnetic poles. By changing a distance between magnets, intensity of a magnetic field may range from 15 to 335 kA/M. An MTJ wafer is disposed on a magnet, and laser reaches the surface during scanning to heat some areas. However, such a technology has disadvantages of a low speed and low precision.

In addition, US Patent No. US2007/0187670A1 discloses an opto-thermal annealing mask and method. The invention improves the precision and spatial resolution of thermal annealing. An opto-thermal annealing mask layer sequentially includes a thermal dissipative layer located on a substrate, a reflective layer disposed on the thermal dissipative layer, and a transparent capping layer disposed on the reflective layer. The opto-thermal annealing mask can be used to form a gate in a field effect apparatus.

Figure 2:
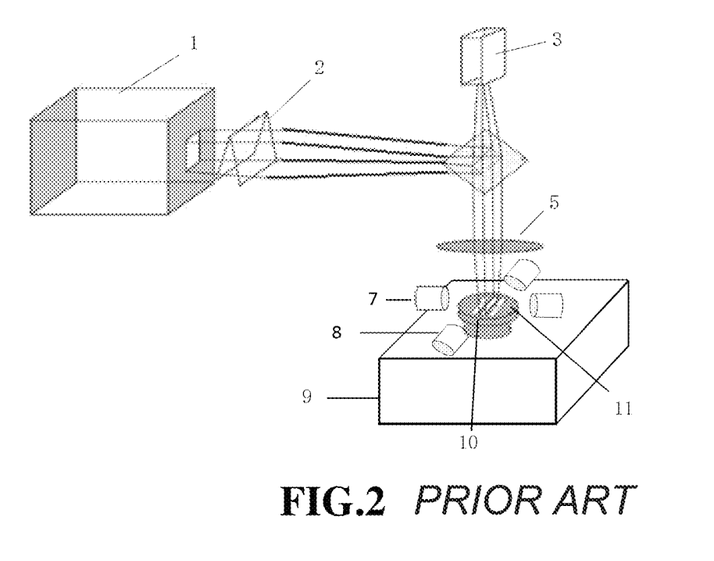
FIG. 2 is a schematic diagram of a laser heating-assisted annealing apparatus for a magnetic thin film.

Chinese Patent Application No. 201110134982.x discloses a single-chip magnetic sensor and a laser heating-assisted annealing apparatus and method thereof. As shown in FIG. 2, the annealing apparatus includes a laser source 1, a reflective mirror 2, a focusing objective lens 5, a charge coupled device (CCD) camera 3, a movable platform 9, an X and Y-axis electromagnet pair 7 and 8, a magnetic field detector 10, a temperature sensor 11, and the like, and can implement local heating and local magnetic moment reversal on a same silicon chip. The resulting push-pull sensor that can be manufactured using this apparatus features high sensitivity, a temperature compensation function, and noise cancellation, and it is suitable for mass production and the like. However, the push-pull bridge requires ferromagnets of different bridge arms to be set in different directions than the pinned layers, and no good technology or commercial device has the capability to perform the process in a practical manner.

SUMMARY OF THE INVENTION

An objective of the present invention is to provide a rapid thermal processing method and apparatus for programming the pinned layer of spintronic devices, to manufacture a single-chip TMR, GMR, or MTJ sensor in a push-pull bridge, such that the manufactured TMR, GMR, or MTJ sensor has excellent performance.

To implement the foregoing technical objective and achieve the foregoing technical effect, the present invention is implemented by using the following technical solutions:

A rapid thermal processing apparatus for programming the pinned layer of spintronic devices, including a rapid thermal annealing (RTA) light source, a reflective cover, a magnet, and a wafer, where the reflective cover at least includes a transparent insulating layer and a reflective layer, the magnet is used to produce a constant magnetic field, the transparent insulating layer and the reflective layer are sequentially coated on the wafer, the light source is used to send incident light to a heating area of the wafer through the patterned reflective cover, and an antiferromagnetic layer on a wafer may be locally programmed by controlling the exposure time of the light source, for heating a specific area on the wafer to a temperature above the blocking temperature of the antiferromagnetic layer, and then turning off the magnetic field after the heating area has cooled in the presence of the applied magnetic field.

Preferably, the light source is a single bulb or a bulb array.

Preferably, the apparatus further includes a slit used to restrict light to be incident on an area of the wafer.

Preferably, the wafer is movable and is disposed on a conveying belt.

Preferably, the apparatus is disposed in an RTA furnace.

Preferably, the magnet is a permanent magnet.

Preferably, the magnet is a superconducting permanent magnet.

Preferably, the reflective cover includes two transparent insulating layers and one reflective layer, and the reflective layer is located between the two transparent insulating layers.

Preferably, the transparent insulating layer is tetraethyl orthosilicate (TEOS), silicon nitride (SiN), or a photoresist.

Preferably, the reflective layer is made of any material that can reflect infrared light, visible light, or ultraviolet light.

Preferably, the reflective layer is made of a metal.

Preferably, the transparent insulating layer is an anti-reflection layer.

Preferably, the wafer includes a substrate and a magnetoresistive (MR) thin-film layer, the substrate is made of silicon and includes an electronic circuit, and the MR thin-film layer is deposited on the substrate.

Another aspect of the present invention further provides a rapid thermal processing method for programming the pinned layer of spintronic devices, including the following steps:

(1) disposing an RTA light source above a furnace, for heating an MR thin-film layer of a wafer;

(2) disposing a reflective cover above the wafer, where the reflective cover at least includes a transparent insulating layer and a reflective layer; and patterning the reflective cover, where when some areas below the reflective cover are heated, other areas remain cooled;

(3) forming a slit between the reflective cover and the light source, for restricting light to be incident on an area of the wafer; and moving the wafer, such that when the wafer is moved below the slit, the light source can heat the wafer part that is not blocked by the reflective cover;

(4) disposing a magnet below the movable wafer, to produce a constant magnetic field; and (5) locally programming an antiferromagnetic layer by controlling the exposure time, for heating a specific area on the wafer to a temperature above the blocking temperature of the antiferromagnetic layer, and then turning off the magnetic field after the heating area has cooled in the presence of the applied magnetic field.

Preferably, the reflective cover includes two transparent insulating layers and one reflective layer, and the reflective layer is located between the two transparent insulating layers.

Preferably, the rapid annealing light source includes a single bulb or a bulb array.

Preferably, the transparent insulating layer may be TEOS, SiN, or a photoresist.

Preferably, the transparent insulating layer is an anti-reflection layer.

Preferably, the reflective layer is made of any material that can reflect infrared light, visible light, or ultraviolet light.

Preferably, the reflective layer is made of a metal.

Preferably, the wafer includes a substrate and an MR thin-film layer, the substrate is made of silicon and includes an electronic circuit, and the MR thin-film layer is deposited on the substrate.

Compared with the prior art, the present invention has the following advantages: by means of the RTA method and apparatus, the spatial resolution of laser annealing is improved, the processing time is further reduced, a wafer with excellent performance can be rapidly produced, and it is suitable for mass production.

BRIEF DESCRIPTION OF THE DRAWINGS

To describe the technical solutions in technologies of the embodiments of the present invention more clearly, the accompanying drawings required for describing the embodiments are briefly introduced in the following. Apparently, the accompanying drawings in the following description are merely some embodiments of the present invention, and persons of ordinary skill in the art may still derive other drawings from these accompanying drawings without creative efforts.

DETAILED DESCRIPTION

To enable persons skilled in the art to more easily understand the advantages and features of the present invention, preferred embodiments of the present invention are described in detail below with reference to the accompanying drawings, to define the protection scope of the present invention more clearly.

Embodiments

Figure 3:
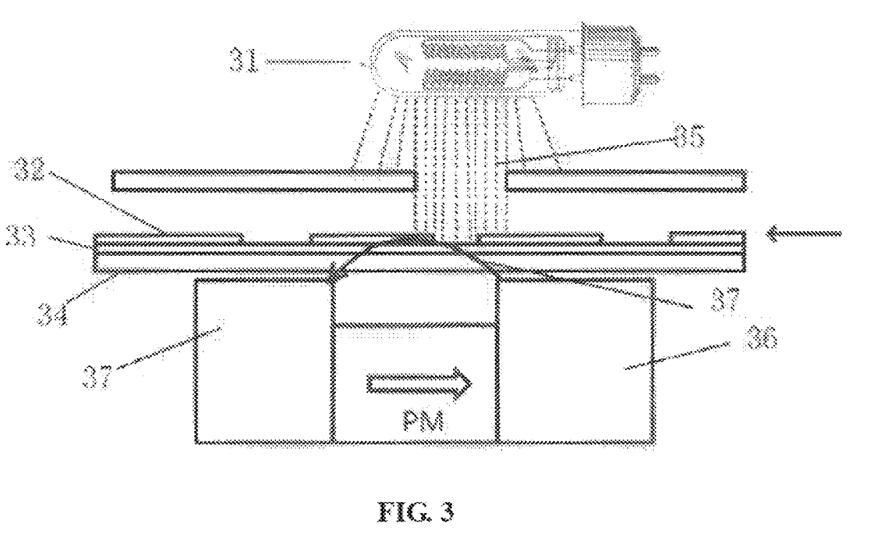
FIG. 3 is a schematic diagram of magnetic thermal annealing with a cover.

FIG. 3 is a schematic diagram of magnetic thermal annealing with a reflective cover according to the present application. As shown in FIG. 3, a wafer 34 is coated with a transparent insulating layer 33 and a reflective layer 32, and the reflective layer is covered and etched to expose an area to be heated. The wafer 34 is moved below an RTA slit lamp 31 at a constant speed. When the wafer 34 passes a slit 35, the RTA slit lamp 31 heats an area of the MR wafer that is not covered by a thin film. When the wafer 34 passes the slit edge, the heated area is gradually cooled, and then applied to a magnetic field. The arrow direction in the figure is the movement direction of the wafer, which is from right to left.

Figure 4:
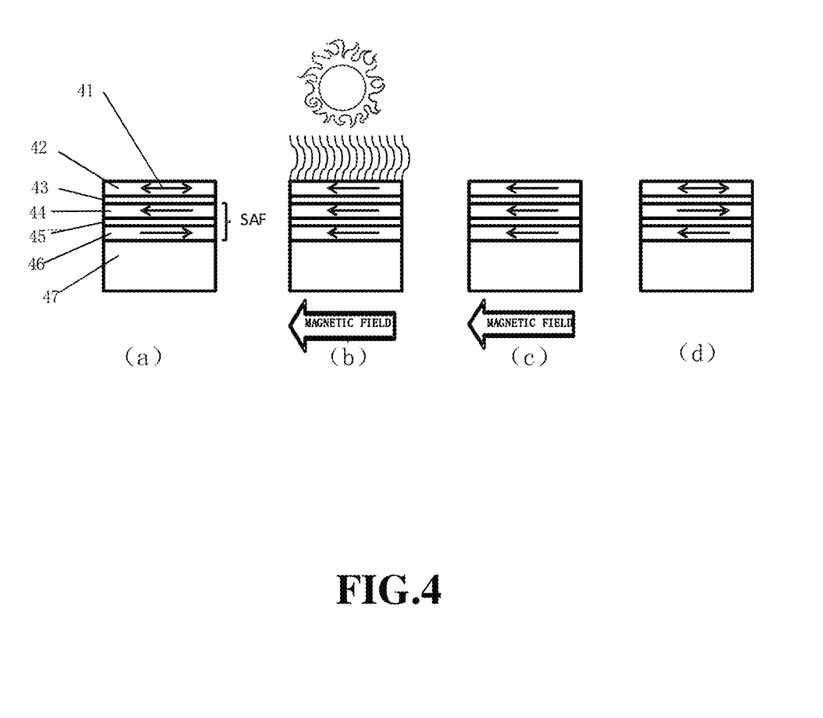
FIG. 4 is a process diagram of thermal magnetic resetting of a pinned layer.

FIG. 4 is a process diagram of thermal magnetic resetting of a pinned layer. As shown in FIG. 4, 41 is a ferromagnetic moment, 42 is a free ferromagnetic layer, 43 is an insulating tunnel junction, 44 is a reference ferromagnetic layer, 45 is a copper exchange coupling layer, 46 is a ferromagnetic pinned layer, and 47 is an antiferromagnetic layer. It can be seen from FIG. 4(*a*) to FIG. 4(*d*) that a saturated magnetic field is applied in FIG. 4(*b*), and after the heating temperature exceeds a blocking temperature TB of the antiferromagnetic layer, magnetization directions applied to the ferromagnetic layer in the saturated magnetic field are consistent. In FIG. 4(*c*), a light source is closed, and then the applied magnetic field is cooled. After the applied magnetic field is cooled, when magnetization directions in the pinned layer are consistent, the interface between the ferromagnetic layer and the antiferromagnetic layer is rotated and locked because the antiferromagnetic substance is cooled to a temperature below the blocking temperature. Finally, the magnetic field is closed, and the antiferromagnetic layer is secured, as shown in FIG. 4(*d*).

The blocking temperature TB and a Néel temperature TN are defined. The TN is a transitional stage between antiferromagnetism and paramagnetism. At the TN, antiferromagnetic rotation is not locked at a proper position according to the magnetic field and temperature. The TB is a blocking temperature, and the blocking temperature may be aligned with the magnetic field during full rotation. The TB is always lower than the TN. The TB is controlled by a particle size of the antiferromagnetic layer. A large particle has a higher blocking temperature than a small one. The TB is equal to the TN if the sample sample and particles are large. In some cases, the antiferromagnetic layer and the ferromagnetic pinned layer need to be heated to a temperature higher than the TB of the antiferromagnetic layer, and then cooled to a temperature lower than the TB, and a magnetic field is exerted to fix the direction of the magnetic moment of the pinned layer.

Figure 5:
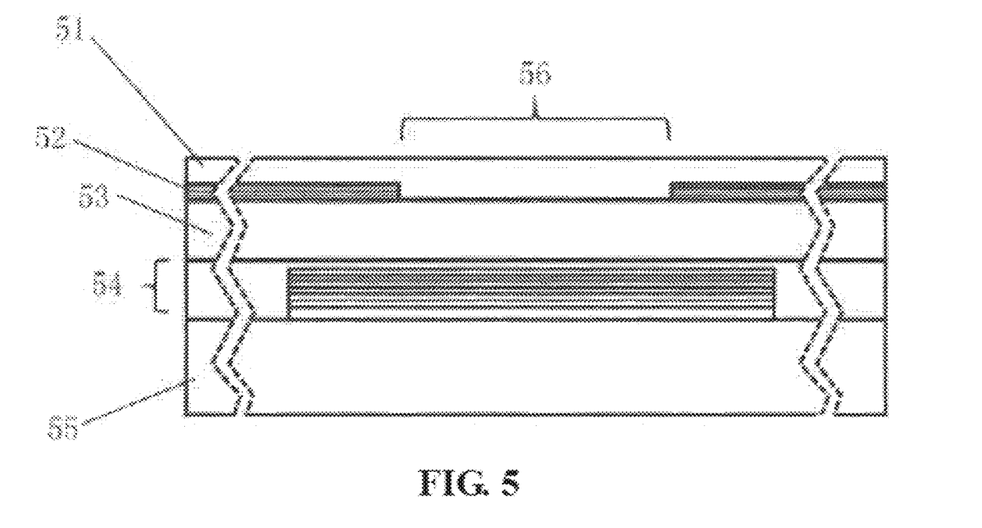
FIG. 5 is a schematic diagram of a cross section of a reflective cover and a wafer.

FIG. 5 is a schematic diagram of a cross section of a reflective cover and a wafer. 51 is a transparent insulating layer, 52 is a reflective layer, 53 is also a transparent insulating layer, 54 is an MR thin-film (magneto-resistive head) layer, 55 is a substrate, and 56 is a heating area with a patterned opening.

Figure 6:
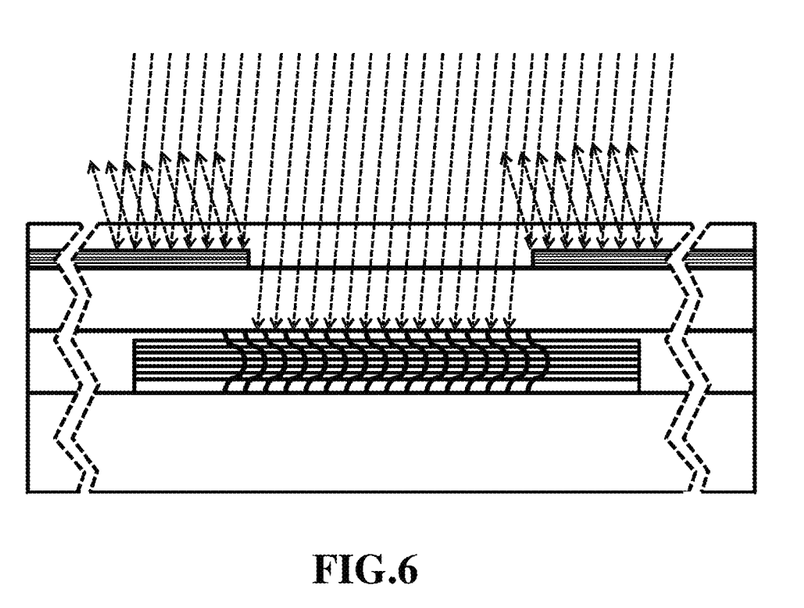
FIGS. 6 and 7 are schematic diagrams of heating with a cover.
Figure 7:
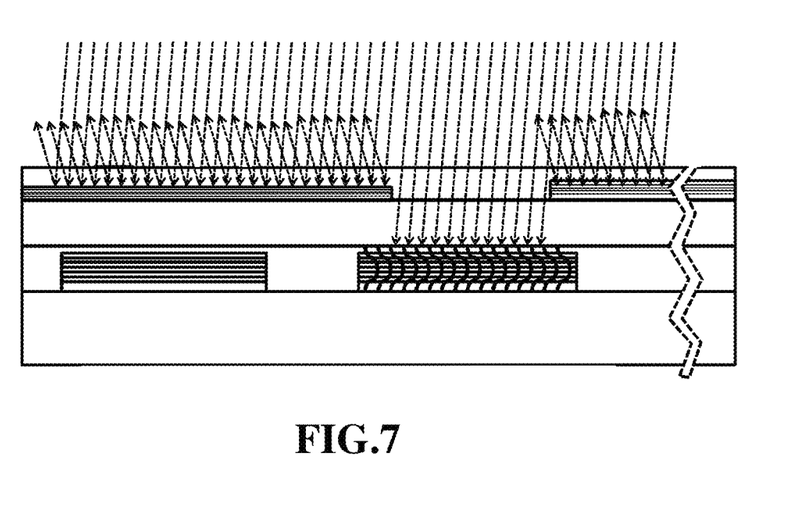

FIGS. 6 and 7 are schematic diagrams of heating with a reflective cover. It can be seen from FIG. 6 that incident light is sent and heats the MR thin-film layer, most of the incident light is reflected back, and some incident light passes through the patterned window of the reflective cover, and is received by the surface of the MR thin-film layer, and converted into heat. If the irradiation time is short, it is likely to heat only a part of the wafer structure below the slit. However, because the heating process depends too much on the exposure time, an unwanted result is caused. A heating time constant and the thermal environment of the MR thin-film layer determine the spatial resolution of the heating area.

FIG. 7 shows a relatively good heating structure. Using an MTJ wafer as an example, a metal material of the MTJ has higher thermal conductivity than an insulator. Therefore, even if two ends of the MTJ are not exactly aligned with the slit, it is possible to only heat the material of the MTJ. The slit needs to be precise enough, to ensure that heat can be provided to a part of the MTJ, and the entire MTJ may be heated enough by heat transfer. An insulative material having poor thermal conductivity may prevent the part covered by the reflective cover from being heated. Therefore, the thermal conductivity of the MTJ needs to be far greater than that of the insulative material. If MTJs can be patterned appropriately, and an area between the MTJs is set to be large enough, flexibility of a local heating process will be improved more.

To improve the spatial resolution, the MR thin film may be patterned, such that a discontinuous MR thin-film structure is formed below the patterned window of the reflective cover, and all the thin-film structure needs to be heated, such that the border of the heating area can be determined by edges of the reflective cover and the MR structure.

The transparent insulating layer may be an anti-reflection coating (used to maximize the thickness of an absorbed half wave of the incident light) including transparent dielectric, such as SiN or a polymer. The polymer is, for example, a photoresist or the like.

A reflective material may be any material that can reflect infrared light, visible light, or ultraviolet light. Aluminum (Al) is a good choice. The MR thin-film layer may be formed by a GMR or MTJ thin film, and the thin film may be processed before or after thermal processing. The substrate may be any smooth substrate, and the MR thin film can be deposited on the substrate. The substrate is usually made of Si, and may also include an electronic circuit.

Figure 8:
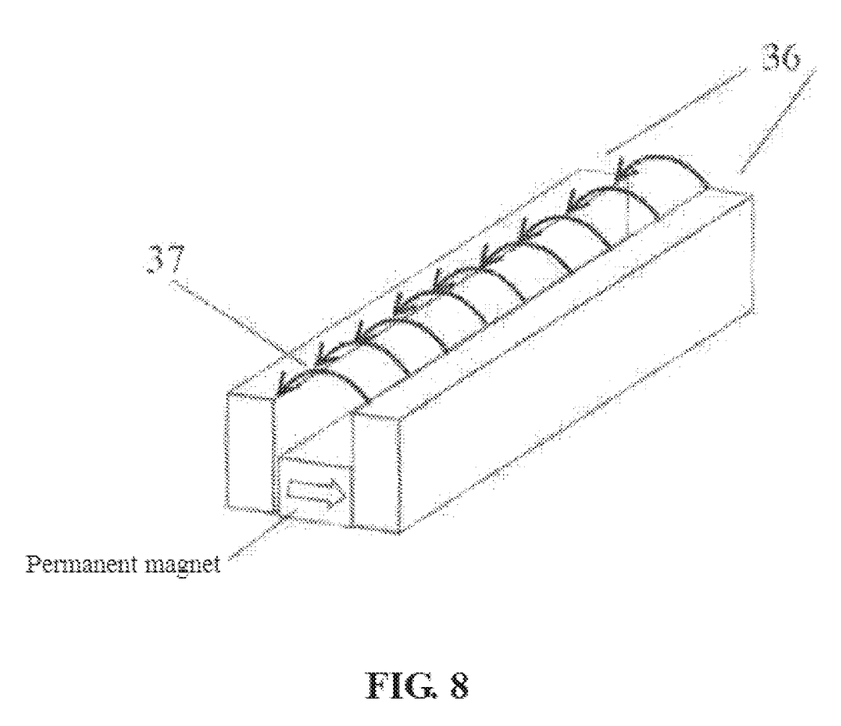
FIG. 8 is a schematic design diagram of a permanent magnet.

FIG. 8 is a schematic design diagram of a permanent magnet. There are two magnetic poles 36, and the permanent magnet is disposed between the two magnetic poles, thereby forming a magnetic field 37. The design is intended to concentrate the magnetic flux of the permanent magnet, such that the magnetic flux is strong, and is parallel to the surface of the silicon wafer. The magnetic pole is mainly formed by a metal alloy including cobalt, iron, and nickel. The permanent magnet has high energy density at a gap, and thus a high-intensity magnetic field is implemented. Rare earth is a good choice.

Figure 9:
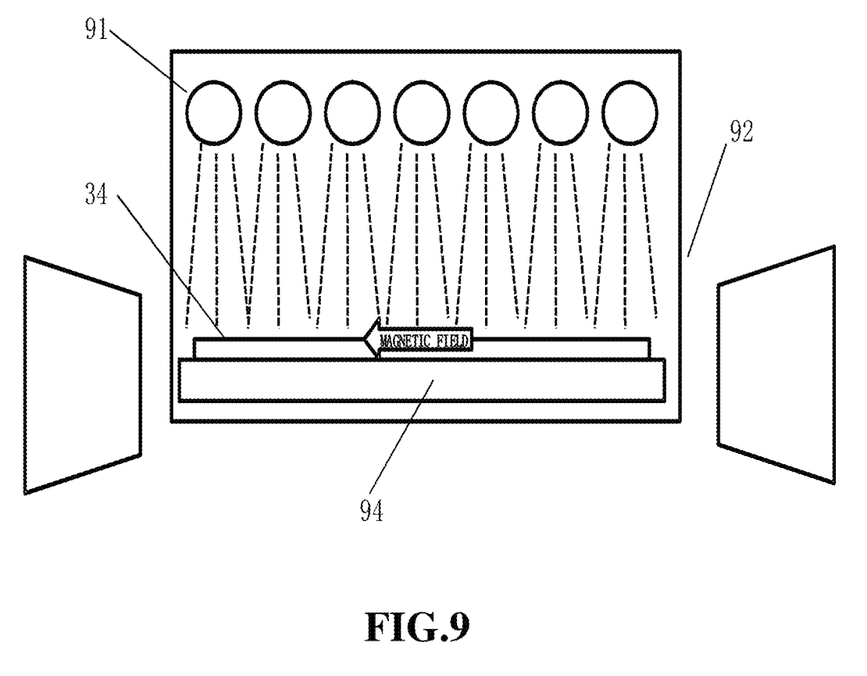
FIG. 9 is a schematic diagram of an overall thin-film system.

FIG. 9 is a schematic diagram of an overall thin-film system. As shown in FIG. 9, the entire thin film is heated by using a pulse lamp in the magnetic field. An RTA bulb array 91 is used for heating the wafer. A heating time may be set for the bulbs by using a pulse, or the wafer may be moved by using a chamber 92. The thermostatic chamber may be a vacuum or nitrogen-filled controlled environment, and is not controlled by air around. The magnet may be a large permanent magnet array or a superconducting magnet. A uniform field of a size of at least 1000 Oe is provided by using the entire wafer surface. A reflective cover is disposed above the wafer, to select areas to be heated. A wafer holder 94 holds the wafer. If necessary, the wafer may be preheated to a certain temperature, and the temperature needs to be lower than the blocking temperature of the antiferromagnetic layer. In another implementation, it may also be used for cooling, to reduce a cooling time.

Specific embodiments of the present invention are described above with reference to the accompanying drawings. Obviously, various modifications may be made to the prior art and methods without departing from the scope and spirit of the present invention. In the technical field of the present invention, various variations can be made within the technical scope of the present invention with common knowledge.

The invention claimed is:

1. A rapid thermal processing apparatus for programming a pinned layer of spintronic devices, the apparatus comprising:
   a rapid thermal annealing light source,
   a reflective cover,
   a magnet configured to produce a constant magnetic field, and
   a wafer,
   wherein the reflective cover at least comprises a transparent insulating layer and a reflective layer,
   the transparent insulating layer and the reflective layer being sequentially coated on the wafer such that the transparent insulating layer is on and in direct contact with the wafer and the reflective layer is on and in direct contact with the transparent insulating layer, the reflective layer further being patterned with an opening in the reflective layer corresponding to a heating area of the wafer,
   wherein the light source is configured to send light through the opening of the reflective layer and through the transparent insulating layer to the heating area of the wafer, and
   wherein the rapid thermal processing apparatus is configured to locally program an antiferromagnetic layer on the wafer by controlling exposure time of the light source-for heating the heating area on the wafer to a temperature above a blocking temperature of the antiferromagnetic layer, and in the presence of the magnetic field.

2. The apparatus according to claim 1, wherein the light source is a single bulb or a bulb array.

3. The apparatus according to claim 1, wherein the apparatus further comprises a slit used to restrict light to be incident on the heating area of the wafer.

4. The apparatus according to claim 1, wherein the apparatus includes a conveying belt configured to move the wafer.

5. The apparatus according to claim 1, wherein the apparatus is disposed in a rapid thermal annealing furnace.

6. The apparatus according to claim 1, wherein the magnet is a permanent magnet.

7. The apparatus according to claim 1, wherein the magnet is a superconducting permanent magnet.

8. The apparatus according to claim 1, wherein the reflective cover comprises two transparent insulating layers and one reflective layer, and the reflective layer is located between the two transparent insulating layers.

9. The apparatus according to claim 8, wherein the transparent insulating layer is tetraethyl orthosilicate (TEOS), silicon nitride (SiN), or a photoresist.

10. The apparatus according to claim 8, wherein the reflective layer is made of any material that can reflect infrared light, visible light, or ultraviolet light.

11. The apparatus according to claim 8, wherein the reflective layer is made of a metal.

12. The apparatus according to claim 10, wherein the transparent insulating layer is an anti-reflection layer.

13. The apparatus according to claim 1, wherein the wafer comprises a substrate and a magnetoresistive (MR) thin-film layer, the substrate is made of silicon and comprises an electronic circuit, and the MR thin-film layer is deposited on the substrate.

14. A rapid thermal processing method for programming the pinned layer of spintronic devices, the method comprising:
   disposing a rapid thermal annealing light source above a furnace for heating a magnetoresistive (MR) thin-film layer of a wafer;
   disposing a reflective cover above the wafer, wherein the reflective cover at least comprises a transparent insulating layer and a reflective layer, and the disposing the reflective cover includes sequentially coating the transparent insulating layer on an in direct contact with the wafer and coating the reflective layer on and in direct contact with the transparent insulating layer;
   patterning the reflective layer with an opening in the reflective layer corresponding to a heating area of the wafer to allow light from the light source to pass through the opening in the reflective layer and through the transparent insulating layer to heat a heating area of the wafer;
   forming a slit between the reflective cover and the light source for restricting light to be incident on the wafer;
   moving the wafer, such that when the wafer is moved below the slit, the light source can heat a wafer part that is not blocked by the reflective cover;
   disposing a magnet to produce a constant magnetic field through which the wafer is moved; and
   locally programming an antiferromagnetic layer by controlling the exposure time for the light to heat the heating area on the wafer to a temperature above a blocking temperature of the antiferromagnetic layer in the presence of the magnetic field.

15. The method according to claim 14, wherein the reflective cover comprises two transparent insulating layers and one reflective layer, and the reflective layer is located between the two transparent insulating layers.

16. The method according to claim 14, wherein the rapid annealing light source comprises a single bulb or a bulb array.

17. The method according to claim 14, wherein the transparent insulating layer may be tetraethyl orthosilicate (TEOS), silicon nitride (SiN), or a photoresist.

18. The method according to claim 14, wherein the transparent insulating layer is an anti-reflection layer.

19. The method according to claim 14, wherein the reflective layer is made of any material that can reflect infrared light, visible light, or ultraviolet light.

20. The method according to claim 14, wherein the reflective layer is made of a metal.

21. The method according to claim 14, wherein the wafer comprises a substrate and the MR thin-film layer, the substrate is made of silicon and comprises an electronic circuit, and the MR thin-film layer is deposited on the substrate.

* * * * *

UNITED STATES PATENT AND TRADEMARK OFFICE
CERTIFICATE OF CORRECTION

PATENT NO. : 11,069,544 B2
APPLICATION NO. : 15/570093
DATED : July 20, 2021
INVENTOR(S) : Deak It is certified that error appears in the above-identified patent and that said Letters Patent is hereby corrected as shown below:

On the Title Page

On page 2, in Column 2, item (56) under "Other Publications", Line 11, delete "May 12, 2019'"," and insert --May 12, 2019",-- therefor On page 2, in Column 2, item (56) under "Other Publications", Line 13, delete "Sep. 29, 2020'"," and insert --Sep. 29, 2020",-- therefor In the Claims In Column 7, Line 33, in Claim 1, delete "layer, and" and insert --layer-- therefor Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*